US007019560B2

(12) United States Patent
Wimmer et al.

(10) Patent No.: US 7,019,560 B2

(45) Date of Patent: Mar. 28, 2006

(54) HIGH VOLTAGE LEVEL TRANSLATOR

(75) Inventors: Guenther W. Wimmer, West Linn, OR (US); David L. Knierim, Wilsonville, OR (US)

(73) Assignee: Xerox Corporation, Stamford, CT (US)

( * ) Notice: Subject to any disclaimer, the term of this patent is extended or adjusted under 35 U.S.C. 154(b) by 646 days.

(21) Appl. No.: 10/263,512

(22) Filed: Jan. 13, 2003

(65) Prior Publication Data

US 2004/0136130 A1 Jul. 15, 2004

(51) Int. Cl.
*H03K 19/0175* (2006.01)
*H03K 19/094* (2006.01)

(52) U.S. Cl. ........................... 326/96; 326/68; 326/95; 327/333; 327/111

(58) Field of Classification Search ............ 326/95–98, 326/63, 68, 83; 327/113, 333, 108, 110
See application file for complete search history.

(56) References Cited

U.S. PATENT DOCUMENTS 5,263,173 A * 11/1993 Gleason ...................... 713/600
5,502,468 A 3/1996 Knierim ...................... 347/19
5,867,049 A * 2/1999 Mohd ......................... 327/200

* cited by examiner

*Primary Examiner*—Daniel D. Chang
(74) *Attorney, Agent, or Firm*—Jeannette He Walder

(57) ABSTRACT

A circuit for controlling a piezoelectric transducer includes an N-channel FET having a gate electrode, a drain electrode coupled to a high voltage signal source Vpp, wherein Vpp is a positive going pulse train, and a source electrode coupled to an output Vcntrl for controlling the transducer and a charging circuit, responsive to a low voltage input signal Vpp_sel, for charging the FET gate to a bias voltage greater than the FET's threshold voltage while Vpp is near zero volts and for maintaining the bias voltage on the FET gate while Vpp ramps up to a value greater than the bias voltage and until Vpp_sel is removed. The control circuit reduces switching time and reduces current spikes in the power supplies to the chip.

22 Claims, 6 Drawing Sheets

HIGH VOLTAGE LEVEL TRANSLATOR

FIELD OF THE INVENTION

This invention relates generally to ink jet printers and more particularly to a voltage level translator for translating low voltage logic signals to high voltage control signals for controlling a capacitive load such as for a piezoelectric transducer.

BACKGROUND OF THE INVENTION

Ink jet printers employ a multi-orifice print head for ejecting ink drops onto a print medium such as paper. An acoustic driver, such as a piezoelectric transducer, is coupled to a diaphragm for ejecting ink drops from an ink chamber, through a nozzle orifice, and onto a print medium. A control signal, provided by a signal source, is applied to the transducer and the diaphragm is displaced according to the voltage of the control signal. A typical signal source provides a positive pulse which lasts for some period of time and then returns to zero volts. The signal remains at zero volts for some period of time and is then followed by a negative pulse which lasts for a period of time and then returns to zero volts. During the positive pulse, the piezoelectric transducer displaces the diaphragm away from the cavity interior and ink from the reservoir is drawn into the cavity. In response to the negative pulse, the diaphragm is displaced, compressing the cavity and an ink drop is ejected from the orifice onto the print medium.

Solid ink piezoelectric transducers require on the order of plus and minus 50 volt waveforms. A common waveform generator is typically used for all jets of a print head. When a particular ink jet is to fire an ink drop, individual electronic switches (which are typically high voltage FETs) connect the waveform to that ink jet. These switches have the ability to disconnect part way through the leading edge of each waveform pulse in order to control the voltage to the jet transducer. The intrinsic load capacitance of the piezoelectric element holds the voltage at the time of disconnect, the switches and load capacitance operating analogous to a "track and hold" network. In a multi-orifice print head, not all of the ink jets produce droplets of the same size or consistency. U.S. Pat. No. 5,502,468, Ink Jet Print Head Drive with Normalization, describes a process for normalizing the ink jets in which voltage adjustment is used to normalize the performance of all the jets within a print head. For each ink jet, the voltage applied during each positive and negative cycle is varied by varying the time of the disconnect in order to ensure that each resulting ink drop has the same size and consistency.

Control logic signals, which are low voltage level signals on the order of 3.3 volts to 5 volts depending on the control logic circuitry, determine which ink jets will print at which time. A voltage level shifter or translator takes the low voltage control logic signals and translates them into the high voltage signals needed to drive the FET switches used to activate the piezoelectric transducers. Many voltage level translators exist. Typical ink jet print head voltage level translator/drivers use P-channel FETs to connect the jets to the positive waveform generator. N-channel FETs are much smaller and generally less expensive for given performance, but are more difficult to drive for high side switching. An important objective of any voltage level translator is the reduction in the time required to translate an input signal to an output signal. Ink jet print head level translator/drivers using P-channel FETs require up to 400 ns to change state. Faster printers typically need 75 ns or less.

SUMMARY OF THE INVENTION

A circuit for controlling a capacitive load, such as a piezoelectric transducer, according to the invention, includes a new architecture for controlling N-channel FETs as high side switches. The control circuit takes low voltage logic level signals (which may be 3.3 volts or 5 volts) and uses them to switch high voltage N-channel FETs whose gates are typically at 50 volts. The control circuit reduces switching time and reduces current spikes in the power supplies to the chip. The control circuit can be used for controlling both the high side (Vpp) pulse train and the low side (Vss) pulse train.

A circuit for controlling a piezoelectric transducer, according to one aspect of the invention includes an N-channel FET switch having a gate electrode, a drain electrode coupled to a high voltage signal source Vpp, wherein Vpp comprises a positive going pulse train, and a source electrode coupled to an output Vcntrl for controlling the transducer. A charging circuit, responsive to a low voltage input signal Vpp_sel, charges the PET gate to a bias voltage greater than the FET's threshold voltage while Vpp is near zero volts and maintains the bias voltage on the gate while Vpp ramps up to a value greater than the bias voltage and until Vpp_sel is removed. The gate capacitance of the N-channel FET gate may be designed such that it is sufficiently large to maintain the bias voltage on the gate until Vpp_sel is removed. When Vpp_sel goes false, the gate charge may be removed by a charge removal circuit such that no substantial DC current is drawn from Vcntrl. The circuit for controlling a piezoelectric transducer may also be used to switch a negative going pulse train Vss.

The charging circuit may include a P-channel FET having a gate electrode driven by Vpp_sel, a source electrode coupled to a bias voltage source, and a drain electrode coupled to a diode for driving the FET gate. The charge removal circuit may include a second N-channel FET having a gate electrode, a drain electrode coupled to the gate of the N-channel FET and a source electrode coupled to Vcntrl, a diode coupled between the gate of the second N-channel FET and Vcntrl and a capacitor coupled between Vpp_sel and the gate of the second N-channel FET.

The circuit for driving the piezoelectric transducer may also include means for preventing the charging circuit from discharging the FET gate when Vpp exceeds the bias voltage. The preventing means may include a third N-channel FET having a gate electrode coupled to the gate of the N-channel FET, a source electrode coupled to Vcntrl and a drain electrode coupled to the gate of the second N-channel FET.

A circuit for controlling a piezoelectric transducer, according to anther aspect of the invention, includes an N-channel FET having a gate electrode, a drain electrode coupled to a high voltage signal source Vpp, wherein Vpp comprises a positive going pulse train, and a source electrode coupled to an output Vcntrl for controlling the transducer; and a gate control circuit, for controlling the voltage on the FET gate. The gate control circuit includes a charging circuit, responsive to a low voltage input signal Vpp_sel, for providing a bias voltage greater than Vpp to the FET gate while Vpp is near zero volts and for maintaining the bias voltage on the FET gate until Vpp_sel is removed, and a discharging circuit, responsive to removal of the low voltage input signal, for removing charge from the FET gate such that no substantial DC current is drawn from Vcntrl.

The charging circuit may include a P-channel FET having a gate coupled to the low voltage input signal, a source coupled to a bias voltage source and its drain coupled to the FET gate. The discharging circuit may include a second N-channel FET having a gate coupled to the low voltage input signal, a drain coupled to the FET gate and a source coupled to Vcntrl. A parallel circuit including a capacitor and a diode may be used to couple the gates of the P-channel FET and the second N-channel FET. A diode may be added between the drain of the second N-channel FET and Vcntrl for preventing overcharging of the FET gate if the FET is turned on when Vpp is greater than zero volts. A second diode may be added between the gate of the second N-channel FET and Vcntrl for preventing overcharging of the second N-channel FET gate.

DETAILED DESCRIPTION OF THE EMBODIMENTS

Figure 1:
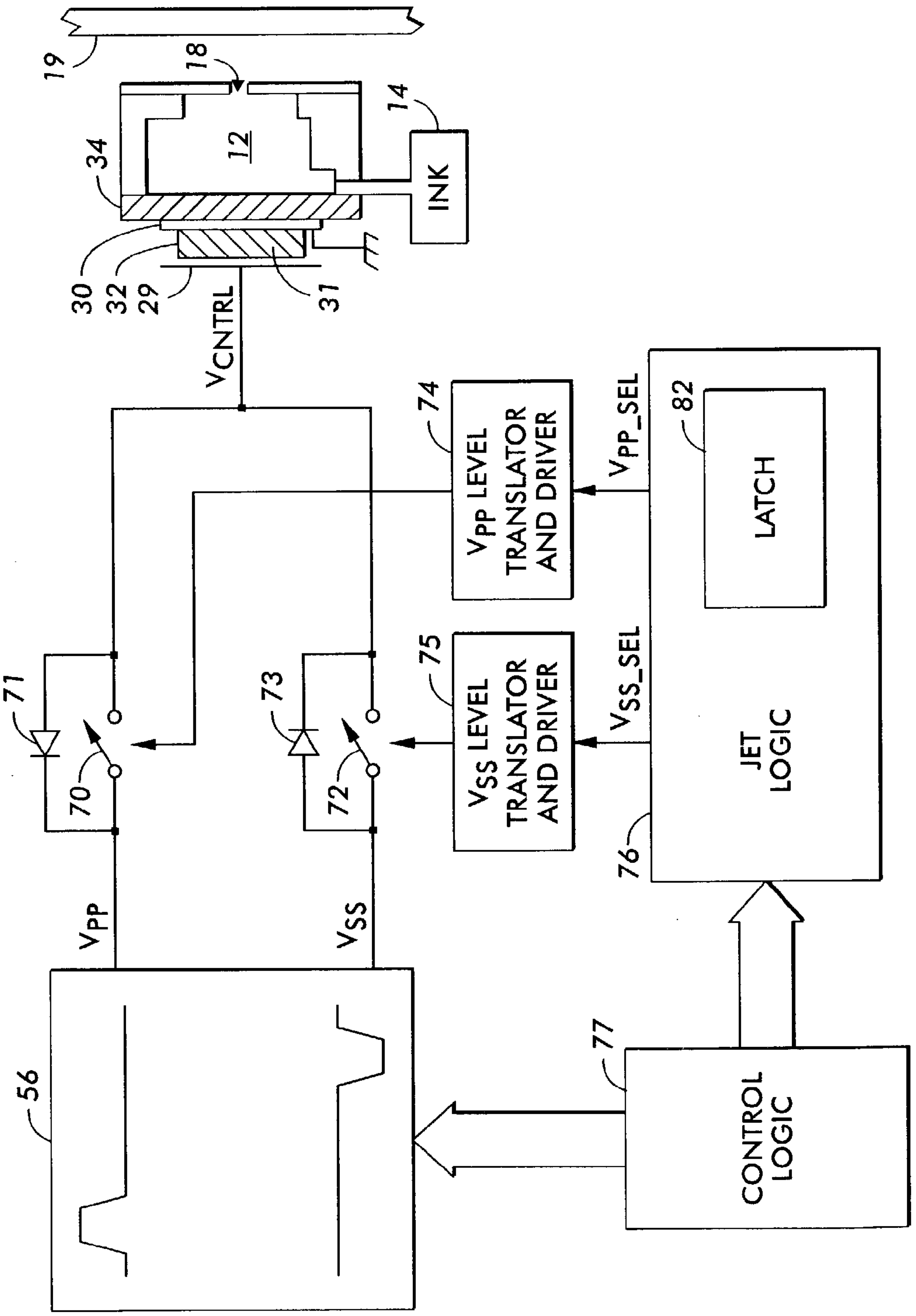
FIG. 1 is a schematic view of a programmable ink jet including drive circuitry.

Referring to FIG. 1, a programmable ink jet is shown therein and includes piezoelectric transducer 32 coupled to diaphragm 34 for ejecting ink drops from an ink reservoir 14, through ink chamber 12 and through a nozzle orifice 18 onto a print medium 19. Transducer 32 includes first conductive electrode 29 and second conductive electrode 30 separated by a layer of insulating piezoelectric material 31. A control signal Vcntrl provided by signal source 56 is applied to the transducer 34 and diaphragm 34 is displaced according to the voltage of the control signal. Signal source 56 generates two signals Vpp and Vss. Vpp is a positive going pulse train, with a minimum of one pulse for each time any of the jets in the print head need to eject ink. Vss is a negative going pulse train, with a single negative pulse following a fixed delay after the end of each positive Vpp pulse. During the positive pulse, the piezoelectric transducer 32 displaces the diaphragm 34 away from the cavity 12 interior and ink from the reservoir 14 is drawn into the cavity 12 In response to the negative pulse, the diaphragm 34 is displaced, compressing the cavity 12 and an ink drop is ejected from the orifice 18 onto the print medium 19.

In this embodiment, each of the FET switches 70 and 72 is an N-channel FET. For each jet there is a FET switch 70 connecting the high side signal Vpp to Vcntrl which drives the piezoelectric transducer for that jet. There is also a FET 72 which connects the low side signal Vss to Vcntrl for that jet. Diodes 71 and 73 are connected across FET switches 70 and 72 respectively to keep Vcntrl between Vss and Vpp when FETs 70 and 72 are off. The gates of FET switches 70 and 72 are controlled from jet logic 76 through level translators 74 and 75, respectively. The level translators convert the standard 0 to 3.3 volt logic level signals Vss_sel and Vpp_sel from jet logic 76 to the appropriate levels for driving the gates of FETs 70 and 72. Latch 82 within jet logic 76 holds a normalization value (disconnect time) in a memory location for that jet. Blocks 70 through 76 are replicated once for each jet. Control logic 77 sends timing, sequencing, and data signals to signal source 56 and to jet logic 76. There may be more than one control logic block 77 for a print head, but typically each control logic block 77 will drive multiple jet logic blocks 76 to control multiple jets.

Jet logic 76 provides low voltage input signals Vss_sel and Vpp_sel for enabling the low side and high side switches, respectively. Vcntrl, the piezoelectric transducer driving voltage for a given jet, is controlled in accordance with the applicable Vss_sel and Vpp_sel signals. During the idle time between Vpp and Vss pulses, FET switch 70 is left on to keep Vcntrl at zero volts. Since Vpp and Vss are both at zero volts in between pulses, either or both of the FET switches 70 and 72 could be turned on. Even if neither of FET switches 70 and 72 were on, Vcntrl would remain near zero volts because of diodes 71 and 73. If the jet is not to fire during a Vpp and Vss pulse pair, then FET switch 70 is kept off during the Vpp pulse and FET switch 72 is kept off during the Vss pulse. The opposite FET switch (72 during the Vpp pulse and 70 during the Vss pulse) may be turned on to help maintain zero volts on Vcntrl. If the jet is to fire during a Vpp and Vss pulse pair, then FET switch 72 is kept off during the Vpp pulse and FET switch 70 is kept off during the Vss pulse. FET switch 70 is turned on before the Vpp pulse starts and is turned off during the rising edge of the Vpp pulse.

The turn-off time is a function of the normalization value stored in latch 82 within jet logic 76. The larger the value in latch 82, the later FET switch 70 is turned off, and therefore the higher the voltage on Vcntrl at the time FET 70 is turned off. Since the piezoelectric transducer 32 presents mostly a capacitive load on Vcntrl, the voltage on Vcntrl will substantially maintain the voltage it had at the time FET switch 70 turned off. As Vpp ramps back down to zero volts at the end of its pulse, diode 71 will conduct to pull Vcntrl back down near zero. The Vss pulse is handled similarly. Before the start of the Vss pulse, FET switch 72 is turned on. It is turned off during the leading (falling) edge of the Vss pulse at a time determined by the value in latch 82. It should be noted that a different latch could be used if separate control of the positive and negative pulse amplitudes is required.

Figure 2:
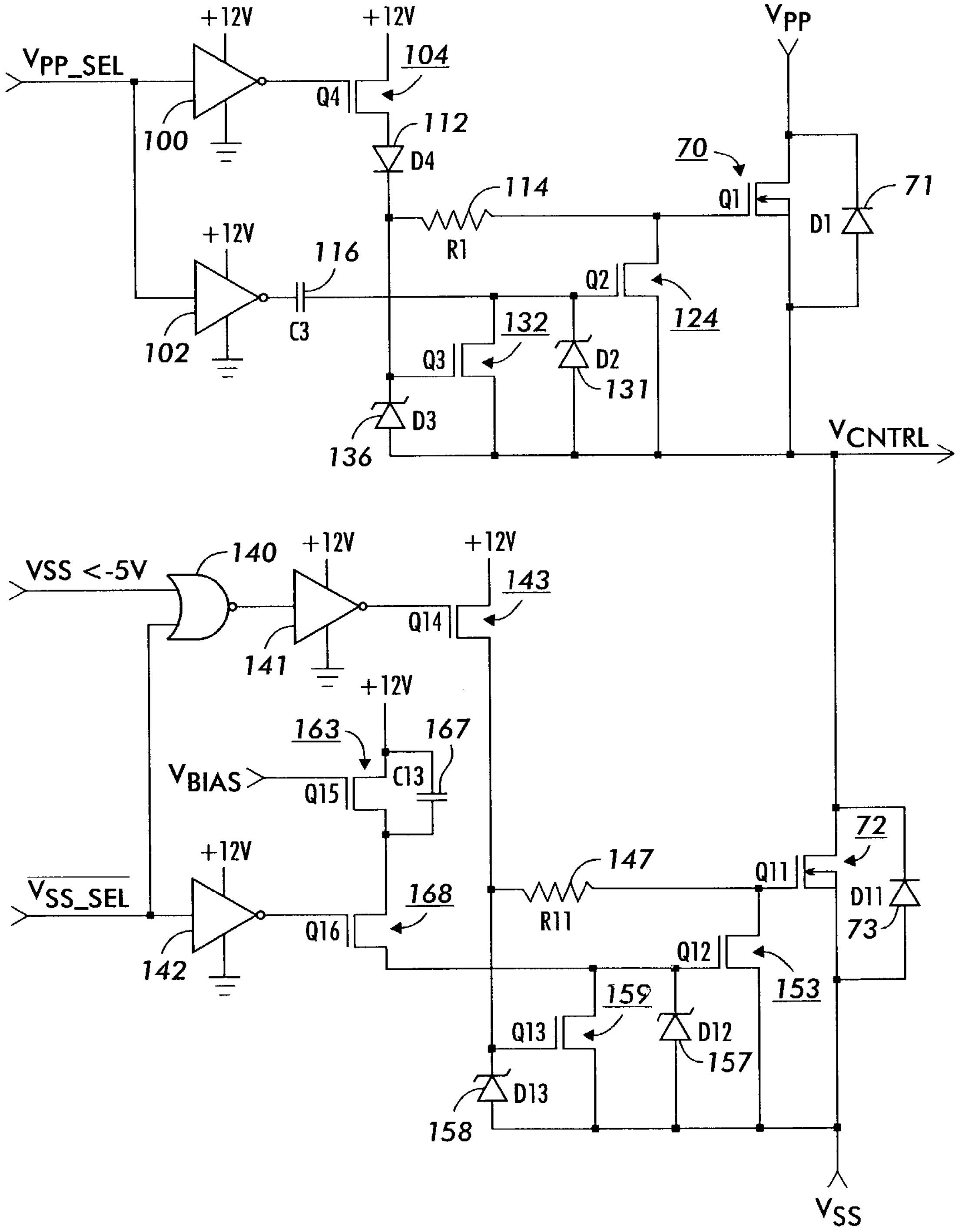
FIG. 2 is a schematic of a high side and low side level translator.

Referring to FIG. 2, a circuit for controlling a piezoelectric transducer using an N-channel FET for the both the Vpp (high side) switch and Vss (low side) switch is shown. The embodiment shown in FIG. 2 may be implemented as an Application-Specific Integrated Circuit (ASIC), but may also be embodied as a hybrid circuit or using discrete components. The circuit shown in FIG. 2 provides higher output currents and lower cost than conventional voltage level translator circuits. By using N-channel FET's for both the high (Vpp) and low (Vss) side drivers, the ASIC chip saves chip area and increases current capability because N-channel FET's are much smaller for a given current. The circuit of FIG. 2 has an additional feature in that the high side drive is enabled before voltage is applied to Vpp.

N-channel FET 70 has its drain coupled to Vpp, the positive going pulse train and its source coupled to Vcntrl. FET 70's gate is driven by a charging circuit which includes P-channel transistor 104 and diode 112. Vpp_sel is the low voltage (on the order of 3.3 volts or 5 volts depending on the logic circuitry used) input signal coming from jet logic 76. Vpp_sel is provided to inverter 100, which both inverts the logic level and translates it from low (3.3) voltage to an intermediate (12 volt) voltage. The output of inverting level translator 100 is used to drive transistor 104 (Q4), which has its source connected to +12 volts supply (which is less than the maximum value of Vpp) and its drain connected, through diode (D4) 110 and optional resistor (R1) 114 to drive the gate of FET 70. The gate of FET 70 is charged while there is no voltage on Vpp. The charging circuit provides a bias voltage on the gate of FET 70, which is greater than the FET gate's threshold voltage while Vpp is near zero volts and maintains that bias voltage on the gate while Vpp ramps up to a value greater than the bias voltage and until Vpp_sel is removed. FET 70 is designed and constructed such that the capacitance of its gate maintains the voltage on the gate while Vpp is charging to its maximum value (or the value determined by normalization) and holds it until Vpp_sel goes false. Resistor 114 may be a 20K ohm resistor. FET 70's gate may carry approximately 2 pF capacitance. As Vpp ramps back down to zero volts at the end of its pulse, diode (D1) 71 will conduct to pull Vcntrl back down near zero.

To facilitate charge removal from the FET gate when Vpp_sel goes false, a charge removal circuit including N-channel FET (Q2) 124 which is coupled between the gate of FET 70 and Vcntrl, removes the gate charge from the gate of FET 70. Diode (D2) 131 keeps the gate of FET (Q2) 124 from dropping below Vcntrl so that a rising edge on the output of inverting level translator 102 can raise the gate voltage of FET (Q2) 124 sufficiently to keep it on and discharge the gate of FET 70. Capacitor (C3) 116 drives the gate of FET (Q2) 124 to discharge the gate of FET 70 without drawing any DC bias current from Vcntrl. Capacitor 116 may have a value of 0.5 pF. Vpp_sel is applied to inverting level translator 102, which both inverts the logic level and translates it from low (3.3) voltage to an intermediate (12 volt) voltage, before being provided to capacitor (C3) 116, which is connected to the gate of transistor 124 (Q2). In the quiescent state, Vpp_sel is set to insure that capacitor 116 is initialized with no charge. For an unselected jet, Vpp_sel would be driven false before the start of the Vpp pulse. For a selected jet, Vpp_sel would be driven false at the normalization disconnect time during the rising edge of Vpp. The falling Vpp_sel edge will cause a rising edge on the gate of transistor 124 via capacitor 116, which will in turn discharge the gate of FET 70 and turn off the output Vcntrl. There is no DC bias current in the Vpp level translator, so the output maintains the normalization voltage on the jet's piezoelectric transducer.

To prevent leakage current or charge injection from unintentionally discharging the gate of FET 70 by the charging circuit, N-channel FET (Q3) 132 may be added. Transistor 132 is coupled between the gate of transistor 124 and Vcntrl and its gate is driven by diode 112. Transistor 132 serves to keep transistor 124 off until the appropriate time in spite of any stray charge injection. Transistor 132 is sized such that its circuit influence may be overdriven by charge coupled through (C3) 116 at normalization disconnect time. Diode (D3) may be added between the gate of transistor 132 and Vcntrl to prevent overcharging of the gate of FET 70 and FET (Q3) 132.

The Vss circuit is similar to the Vpp one, except that the output turn off path is DC coupled. Vss_sel is the low voltage (on the order of 3.3 volts or 5 volts depending on the logic circuitry used) input signal. Vss_sel is provided to inverter 141 though NOR gate 140, and the output of inverting level translator 141 is used to drive the gate of transistor 143 (Q14) in the charging circuit. Transistor 143 has its source connected to +12 volts and its drain connected, through resistor (R11) 147 (which may have a value of 40K ohms) to drive the gate of FET 72. FET 72 has its source connected to Vss and drain connected to Vcntrl. As Vss ramps back up to zero volts at the end of its pulse, diode (D11) 73 will conduct to pull Vcntrl back up near zero.

A charge removal circuit including N-channel FET (Q12) 153 and diode (D12) 157 removes the charge from the gate of FET 72 when Vss_sel goes false. Diode (D12) 157 prevents overcharging of the gate of FET 72. N-channel FET (Q13) 159 keeps transistor 153 off until the appropriate time in spite of any stray charge injection or leakage current. Diode (D13) 158 prevents overcharging of the gate of FET 72 and FET (Q13) 159. Vss_sel is provided to inverting level translator 142 which drives P-channel FET 168 which drives the gate of transistor 153. The output turn off path is DC coupled through P-channel transistors (Q15, Q16) 163 and 168 and capacitor (C13) 167. Vbias drives the gate of transistor 163, which has its source coupled to a +12 volt supply and its drain coupled to the source of transistor 168. Capacitor 167 is coupled across the source and drain of transistor 163, serving to provide a higher transient current during disconnect time than the bias current supplied by transistor (Q15) 163 would alone. Transistor 159 is sized such that its circuit influence may be overdriven by this higher transient current. A small bias current to the Vss rail is acceptable since it is not a bias current to the output Vcntrl.

Both the Vpp and Vss side drives (switches) work by charging the output FET gate while there is no voltage on Vpp or Vss. The gate capacitance maintains that voltage during the pulse until the associated select line (Vpp_sel or Vss_sel) goes false. When the select line transitions false, the gate charge on FET 70 or FET 72 is removed by transistor 124 or 153, respectively. Transistors 132 and 159 serve to keep transistors 124 and 153 off until the appropriate time in spite of any stray charge injection or leakage current.

The signal labeled "VSS<−5V" for driving NOR gate 140 is a conventionally generated logic signal that is high whenever Vss is less than approximately −5 volts. It is used to reduce power dissipation by removing the gate drive to the Vss FET 72 during the Vss pulse. Gate capacitance will maintain the gate voltage during the pulse.

Referring to FIGS. 3–6 an alternative circuit for controlling a piezoelectric transducer using an N-channel FET for the both the Vpp (high side) switch (FIGS. 3 and 4) and Vss (low side) switch (FIGS. 5 and 6) is shown. The embodiment shown in FIGS. 3–6 has been implemented as an Application-Specific Integrated Circuit (ASIC), but may also be embodied as a hybrid circuit or using components.

Figure 3:
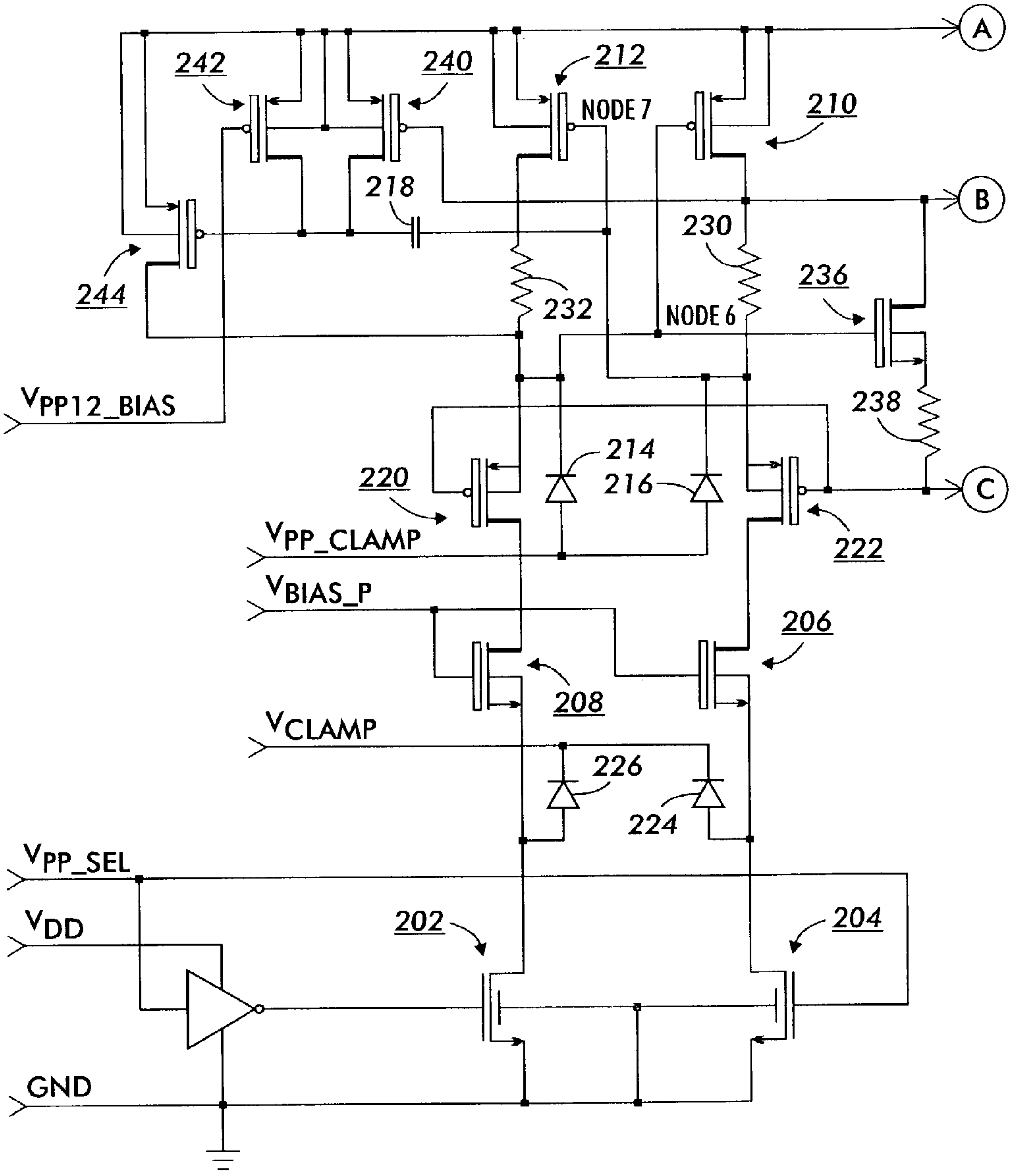
FIGS. 3 and 4 are a schematic of an alternate high side level translator.
Figure 4:
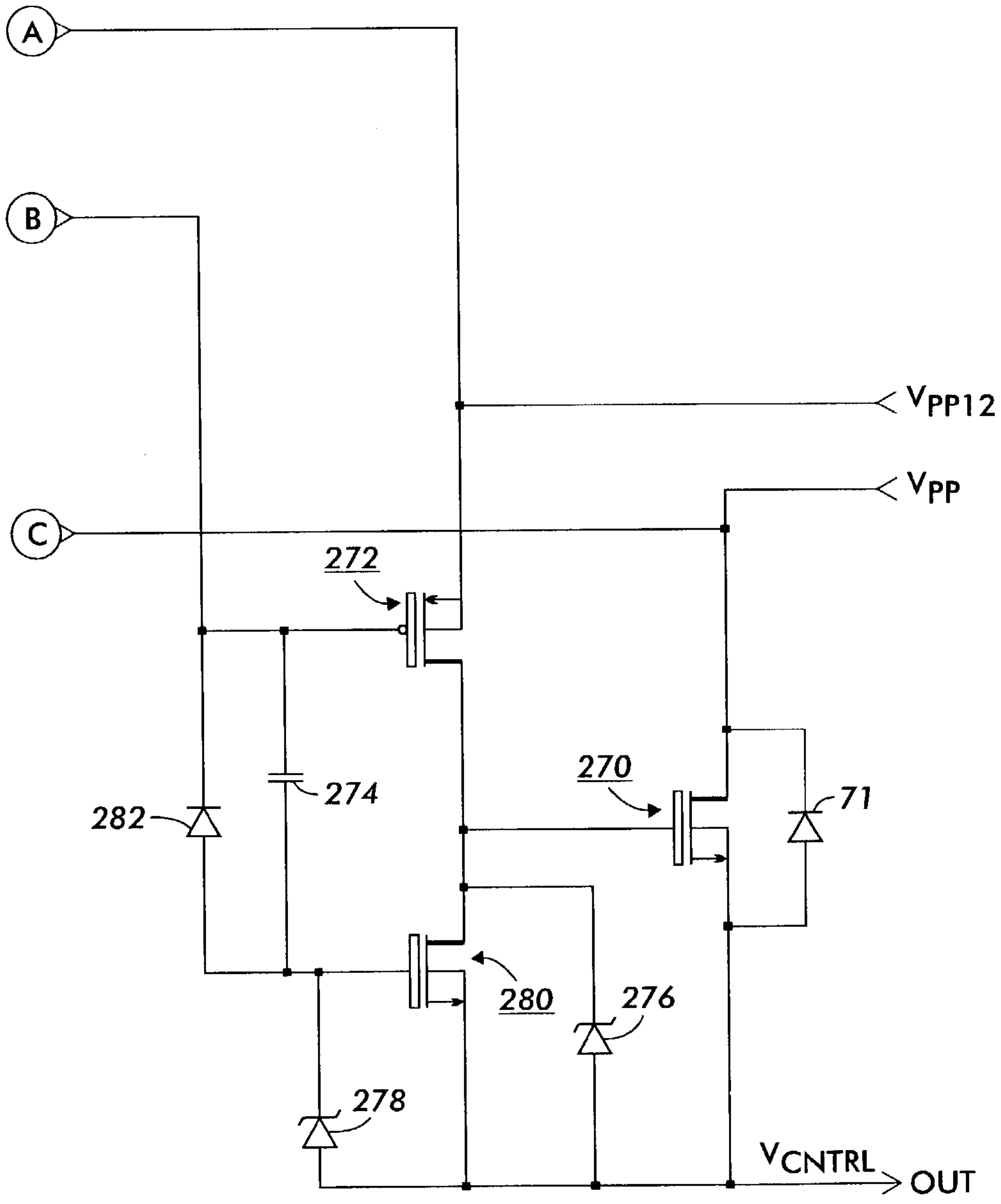

Referring to FIG. 4, N-channel FET 270 has its drain coupled to Vpp, the positive going pulse train, and its source coupled to Vcntrl. The gate of FET 270 is driven by a gate control circuit which includes P-channel FET 272 for charging the gate of FET 270 when Vpp_sel goes high and N-channel FET 280 for discharging the gate of FET 270 when Vpp_sel goes low. The source of FET 272 is coupled to Vpp12, a source voltage which is twelve volts higher than Vpp, and its drain is coupled to the gate of FET 270. FET 270 needs its gate voltage to be more positive than its source voltage to be switched on. Since Vpp12 is always greater than Vpp, sufficient voltage to turn on the gate of FET 270 is always ensured. Vpp_sel is applied to a first stage level translator (shown in FIG. 3) which provides a control signal B to the gate of FET 272, and also to the gate of FET 280 via diode 282 and capacitor 274. When Vpp_sel goes high, the control signal B goes low, causing FET 272 to provide a bias voltage of approximately Vpp12 to the gate of FET 270. When Vpp_sel goes low, control signal B goes high, causing the gate of FET 280 to go high. FET 280 turns on, removing the gate charge from FET 270. Capacitor 274 is connected between control signal B and the gate of transistor 280 to avoid bias current on Vcntrl when FET 270 is off, and to insure that FET 280 remains on after disconnect while VPP continues slewing in spite of stray capacitance. Diode 282 prevents the gate of FET 280 from charging when control signal B is low, in spite of stray capacitance to VSS. Avalanche breakdown diode 278 is provided between the gate and source of FET 280 to prevent overcharging the gate and to prevent the gate from going negative relative to the source. Avalanche breakdown diode 276 may be provided between the source and drain of FET 280 to prevent overcharging of the gate of FET 270 in case FET 270 is accidentally turned on when Vpp is greater than zero. No static current is used in either the on or off state of FET 270. The off state of FET 270 draws no current from Vcntrl. The gate of FET 270 never has more than 12 volts relative to its source.

FIG. 3 illustrates a first stage level translator for taking a low voltage input signal Vpp_sel and outputting a higher voltage control signal B for driving the gate control circuit of FIG. 4. Vpp_sel is a low voltage signal, typically on the order of 3.3 volts. Vpp_clamp is a positive going pulse train which follows Vpp and is always slightly more positive than Vpp. When Vpp_sel is low, FET 202 is on, which turns on FET 208. FET 208 turns on FET 220, which turns on FET 210. After the voltage transition at the gate of FET 210, no current flows in the drain of FETs 208 and 220. With FET 210 turned on, control signal B is approximately the level of Vpp12. Vpp_clamp keeps the sources of FET 220 and FET 222 from going below Vpp due to parasitic capacitances, which also keeps the gates of FET 212 and FET 210 from going below Vpp.

Vpp_sel is applied to the gate of FET 204 and its inverted signal is applied to the gate of FET 202. When Vpp_sel goes high, FET 204 turns on, turning on FET 206. FET 206 turns on FET 222, which turns on FET 212. When FET 212 turns on, FET 210 turns off. The combination of FET 222 turning on and FET 210 turning off causes control signal B to go low. The drain of FET 210, and the source of FET 222 via resistor 230, provide control signal B which drives the gate control circuit for FET 270. Vpp_sel going high also turns off FET's 202, 208, and 220.

When Vpp_sel goes back low, FET's 202, 208, 220, and 210 turn on again. FET's 204, 206, 222, and 212 turn off. Turning on FET 210 drives control signal B hack to approximately the level of Vpp12 again. FET 208 and 206 reduce the peak current during switching. These FETs along with diodes 224 and 226 also limit the maximum drain voltage of FETs 202 and 204. This allows FETs 202 and 204 to be low voltage logic devices as is required to interface with 3 volt logic signals for Vpp_sel.

Switch off time is important in this application, and in particular for controlling the size of the ink drop. Switch off time may be reduced by making FET 210 much larger in geometry (i.e., with a higher current capacity) than FET 212 to decrease the rise time of the control signal B. Resistor 230 may be added to allow switch on to function in spite of the large geometry of FET 210. The addition of resistor 232 allows the gate of FET 210 to be charged faster.

In come cases it may be necessary to compensate for increased switch on time. N-channel FET 236 and resistor 238 may be added to decrease the fall time of control signal B. FET 236 has its drain connected to the drain of FET 210 and its source connected to Vpp through resistor 238. The gate of FET 236 is driven by the source of FET 220 and by the drain of FET 212 via resistor 232. Also, an edge detection circuit consisting of capacitor 218 connected on one side to the gate of FET 212 and on the other side to the drain of P-channel FET 242 and the gate of FET 244 may be added. FETs 242 and 244 have their sources connected to Vpp12. The gate of FET 242 is driven by Vpp12_bias. As the Vpp switch is commanded to turn on (input Vpp_sel is set high), FET 244 is turned on by the negative voltage transition at node 7 (gate of FET 212) via capacitor 218. FET 244 then brings node 6 (the gate of FET 236) positive faster, compensating for the reduced speed caused by adding resistor 232. FET 242 produces a small DC current to discharge the gate of FET 244 after it has accomplished its purpose.

To provide a more rapid discharge of the gate of FET 244, FET 240 may be added. FET 240 has its source connected to Vpp12 and its drain connected to the drain of FET 242 and the gate of FET 244. The gate of FET 240 is driven by control signal B. Once FET 244 (I296) has done its job of pulling node 6 high, which in turn through FET 236 (I293) pulls output control signal B low, FET 240 rapidly discharges the gate of FET 244. This occurs because the gate of FET 240 is connected to output control signal B. Thus FET 240 turns on once the job of bringing output control signal B low is accomplished. This rapid discharge of the gate of FET 244 may be required in case a turn off command is received shortly after a turn on command (in case Vpp_sel is brought back low shortly after being set high).

Figure 5:
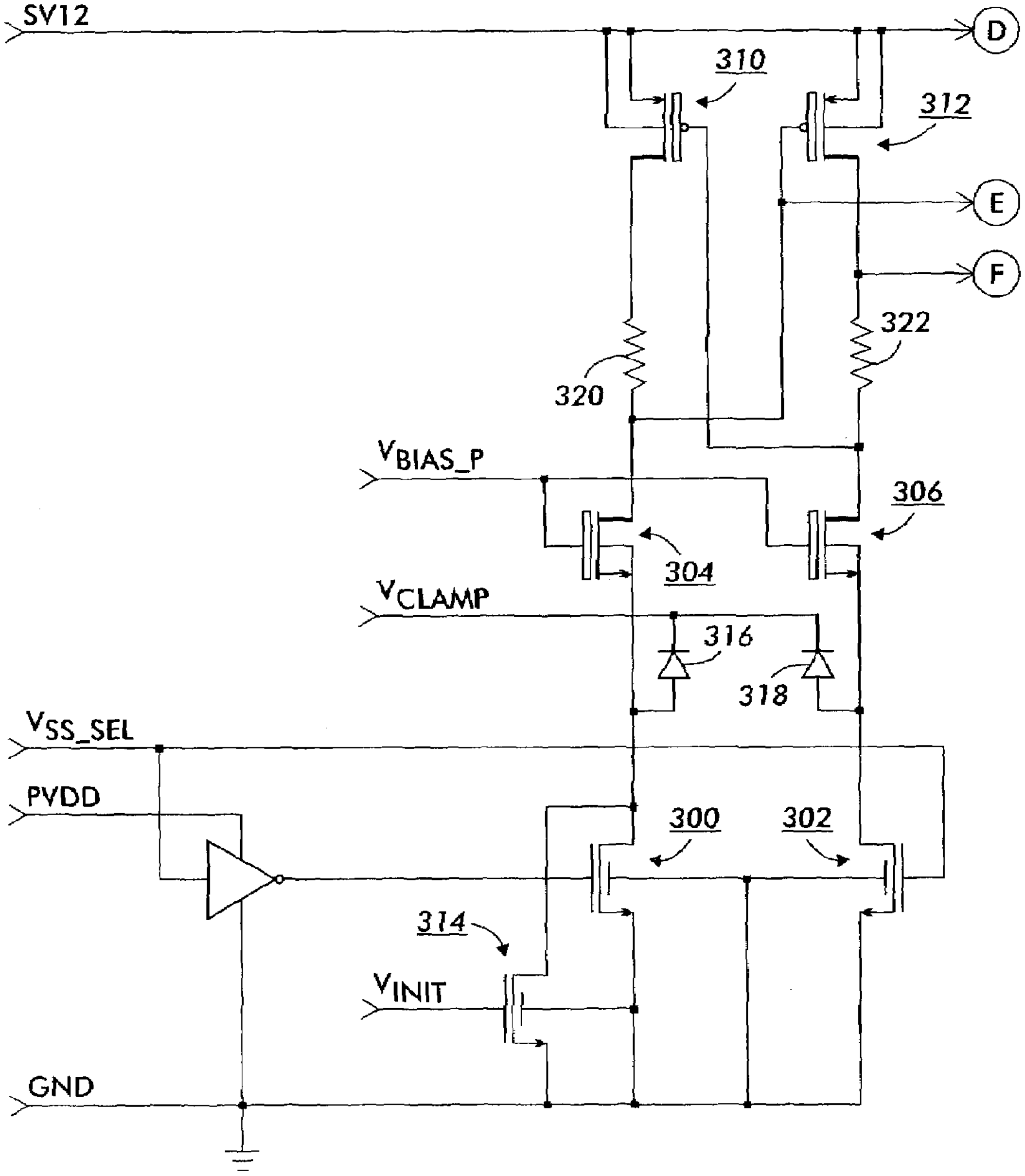
FIGS. 5 and 6 are a schematic of an alternate low side level translator.
Figure 6:
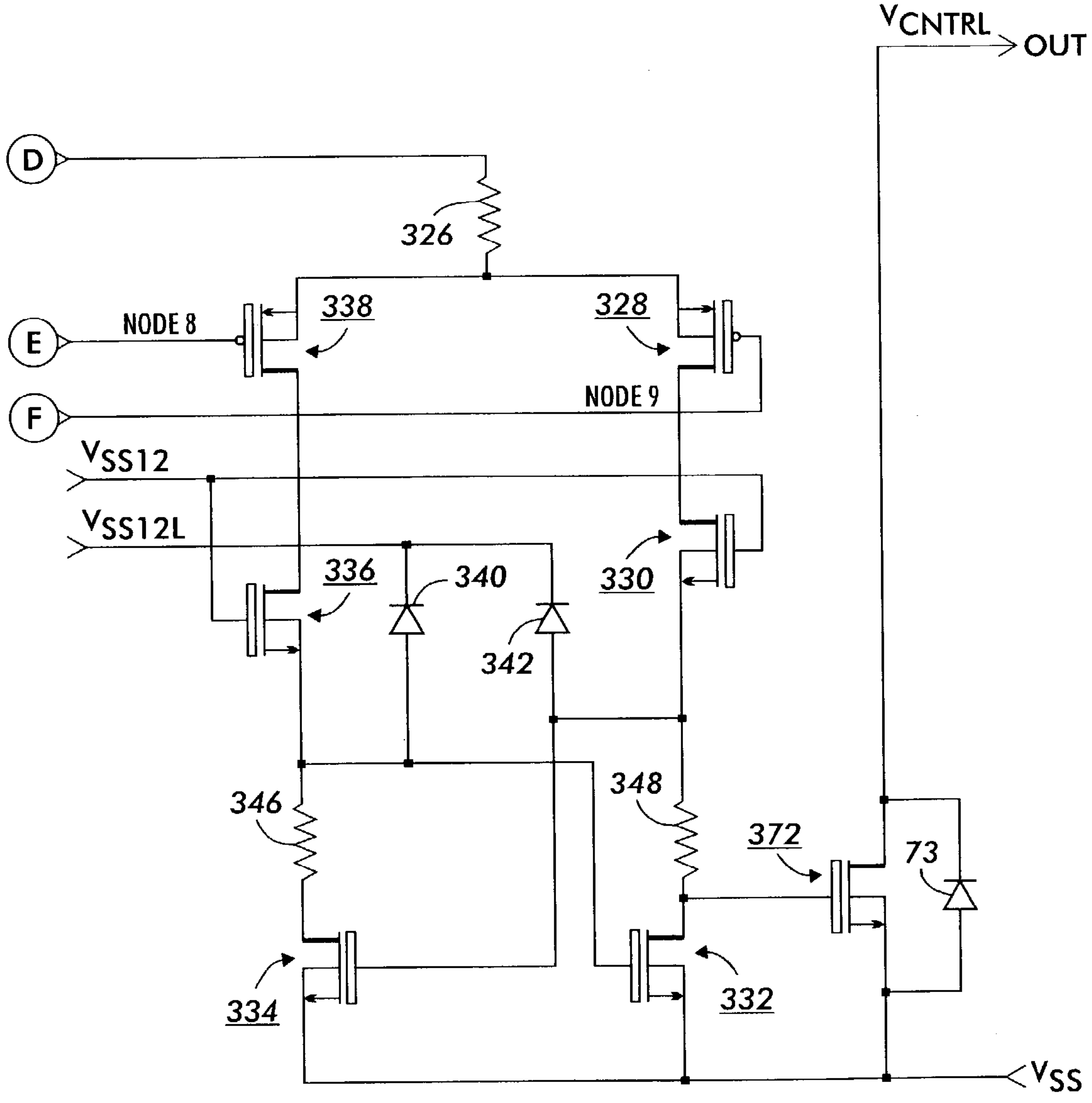

A low side Vss level translator is shown in FIGS. 5 and 6. N-channel FET 372 has its drain coupled to Vcntrl and its source coupled to Vss, the negative going pulse train. A two stage level translator provides a control signal to the gate of FET 372. The first stage translates the Vpp_sel signal from 3 volts to 12 volts (FIG. 5); the second stage translates the 12 volt signal to Vss (FIG. 6). Vss can range from 0 to −60 volts.

The first stage translator is similar to the first stage translator for the Vpp high side. FET's 310 and 312 have their sources connected to a +12 volt supply. The drain of FET 312 provides the control signal F to the second stage translator. Vss_sel is applied to the gate of transistor 302 and its inverted signal is applied to the gate of transistor 300. FETs 300 and 302 have their sources connected to ground. When Vss_sel goes high, FET 302 turns on. The gate of FET 306 is connected to Vbias_p, its source connected to the drain of FET 302, and its drain connected to the gate of FET 310 and resistor 322. When FET 302 turns on, FET's 306 and 310 turn on. FET 310 has its drain connected to resistor 320. The opposite side of resistor 320 is connected to the gate of FET 312 and signal E, which drives node 8 on FIG. 6. The drain of FET 312 provides control signal F to the second stage level translator. When Vss_sel goes low, FET 300 turns on, which turns on FET 304, which turns on FET 312. Vss_sel going low turns off FET's 302, 306, and 310.

FETs 304 and 306 reduce peak switching current in the first stage translator. With diodes 316 and 318 connected to V_clamp, FETs 304 and 306 limit the maximum drain voltage of FETs 300 and 302, allowing those devices to be low voltage logic FETs. The switch off time may be reduced by adding resistors 320 and 322 in the first translator and resistors 346 and 348 in the second translator. Note the asymmetric connection of the second translator to the first, with node 8 to the lower side of resistor 320 and node 9 to the upper side of resistor 322. Compensation for any increased switch on time may not he required because parasitic capacitances are lower on the critical nodes of the Vss translator (e.g., the drains of FET's 328 and 338) in the fabrication process used for this ASIC. Resistor 326 (FIG. 6)

reduces peak switching currents in the second stage translator. FET 314 driven by V_init may be coupled between ground and the drain of FET 300 to prevent the low side output FET 372 from turning on in the case that the 12 volt supply (SV12 and VPP12) were applied before the logic supply (VDD). This avoids the possible condition of both output FETs (270 and 372) being on simultaneously.

The invention has been described with reference to particular embodiments for convenience only. Modifications and alterations will occur to others upon reading and understanding this specification taken together with the drawings. The embodiments are lo but examples, and various alternatives, modifications, variations or improvements may be made by those skilled in the art from this teaching which are intended to be encompassed by the following claims.

What is claimed is:

1. A circuit for controlling a capacitive load, comprising:

an N-channel FET having a gate electrode, a drain electrode coupled to a high voltage signal source Vpp, wherein Vpp comprises a positive going pulse train, and a source electrode coupled to an output Vcntrl for controlling the load; and a charging circuit, responsive to a low voltage input signal Vpp_sel, for charging the FET gate to a bias voltage greater than the FET gate's threshold voltage while Vpp is near zero volts and for maintaining the bias voltage on the FET gate while Vpp ramps up to a value greater than the bias voltage and until Vpp_sel is removed.

2. The circuit of claim 1, wherein the capacitance of the N-channel FET gate maintains the bias voltage on the gate until Vpp_sel is removed.

3. The circuit of claim 1, further comprising:

a charge removal circuit, responsive to removal of Vpp_sel, for removing the charge on the FET gate such that no substantial DC current is drawn from Vcntrl.

4. The circuit of claim 3, further comprising:

means for preventing the charging circuit from discharging the FET gate when Vpp exceeds the bias voltage.

5. The circuit of claim 4, wherein the charging circuit comprises a P-channel FET (Q4) having a gate electrode driven by Vpp_sel, a source electrode coupled to a bias voltage source, and a drain electrode coupled to a first diode for driving the N-channel FET gate.

6. The circuit of claim 5, wherein the charge removal circuit comprises a second N-channel FET (Q2) having a gate electrode, a drain electrode coupled to the gate of the N-channel FET and a source electrode coupled to Vcntrl, a second diode coupled between the gate of the second N-channel FET and Vcntrl and a capacitor coupled between Vpp_sel and the gate of the second N-channel FET.

7. The circuit of claim 6, wherein the preventing means includes a third N-channel FET (Q3) having a gate electrode coupled to the gate of the N-channel FET, a source electrode coupled to Vcntrl and a drain electrode coupled to the gate of the second N-channel FET.

8. The circuit of claim 7, further comprising a third diode coupled between the gate of the third N-channel FET and Vcntrl.

9. The circuit of claim 8, further comprising a resistor coupled between the first diode and the gate of the N-channel FET.

10. The circuit of claim 1, wherein Vpp_sel is removed at a predetermined normalization time.

11. A circuit for controlling a capacitive load, comprising:

an N-channel FET having a gate electrode, a source electrode coupled to a high voltage signal source Vss, wherein Vss comprises a negative going pulse train, and a drain electrode coupled to an output Vcntrl for controlling the load;

a charging circuit, responsive to a low voltage input signal Vss_sel, for charging the FET gate to a bias voltage greater than the FET's threshold voltage while Vss is near zero volts and for maintaining the bias voltage on the FET gate until Vss_sel is removed;

a charge removal circuit, responsive to removal of Vss-_sel, for removing the charge on the FET gate such that no substantial DC current is drawn from Vcntrl;

wherein the charging circuit comprises a P-channel FET (Q14) having a gate electrode driven by Vss_sel, a source electrode coupled to an intermediate voltage source, and a drain electrode coupled to the gate of the N-channel FET.

12. A circuit for controlling a capacitive load, comprising:

an N-channel FET having a gate electrode, a drain electrode coupled to a high voltage signal source Vpp, wherein Vpp comprises a positive going pulse train, and a source electrode coupled to an output Vcntrl for controlling the load; and a gate control circuit, for controlling the voltage on the FET gate, wherein the gate control circuit includes a charging circuit, responsive to a low voltage input signal Vpp_sel, for providing a bias voltage greater than Vpp to the FET gate while Vpp is near zero volts and for maintaining the bias voltage on the FET gate until Vpp_sel is removed, and a discharging circuit, responsive to removal of the low voltage input signal, for removing charge from the FET gate such that no substantial DC current is drawn from Vcntrl.

13. The circuit of claim 12, wherein the charging circuit comprises a P-channel FET having a gate coupled to the low voltage input signal, a source coupled to a bias voltage source and its drain coupled to the N-channel FET gate; and wherein the discharging circuit comprises a second N-channel FET having a gate coupled to the low voltage input signal, a drain coupled to the N-channel FET gate and a source coupled to Vcntrl.

14. The circuit of claim 13, further comprising:

a parallel circuit comprising a capacitor and a diode coupled between the gates of the P-channel FET and the second N-channel FET.

15. The circuit of claim 13, further comprising a diode coupled between the drain of the second N-channel FET and Vcntrl for preventing overcharging of the N-channel FET gate if the N-channel FET is turned on when Vpp is greater than zero volts.

16. The circuit of claim 13, further comprising a diode coupled between the gate of the second N-channel FET and Vcntrl for preventing overcharging of the second N-channel FET gate.

17. The circuit of claim 12, further comprising a level translator for translating Vpp_sel to an intermediate voltage control signal.

18. The circuit of claim 17, wherein the level translator comprises:

a first circuit, responsive to Vpp_sel when Vpp_sel is high, for translating the low voltage signal to an intermediate control signal; and a second circuit, responsive to Vpp_sel when Vpp_sel is low, for removing the intermediate control signal.

19. The circuit of claim 18, wherein each of the first circuit and the second circuits includes complementary elements, wherein the first circuit comprises:

a first FET driven by Vpp_sel;

a second FET driven by Vpp and connected in series with the first FET; and a third FET, wherein the source of the third FET is connected to a voltage source greater than Vpp and the drain of the third FET provides the intermediate control signal;

wherein the third FET is turned on before Vpp_sel is applied;

wherein when Vpp_sel goes high, the first FET turns on, followed by the second FET, then the third FET of the second circuit turns on and the third FET of the first circuit turns off.

20. The circuit of claim 19, wherein each of the first circuit and the second circuit comprises a fourth FET connected in series between the first FET and the second FET, wherein the fourth FET is driven by a second bias voltage and reduces peak current during switching.

21. The circuit of claim 20, further comprising:

a resistor connected in series between the drain of third FET and the source of the second FET for reducing switch off time.

22. The circuit of claim 21, further comprising:

a fifth FET driven by the source of the second FET of the second circuit and a second resistor for reducing switch on time, whereon the drain of the fifth FET is connected to the drain of the third FET and the source of the fifth FET is connected to the second resistor; and wherein the other side of the resistor is connected to Vpp.

* * * * *